(12) United States Patent
Pichler et al.

(10) Patent No.: US 12,205,842 B2
(45) Date of Patent: Jan. 21, 2025

(54) WAFER CHUCK FOR A LASER BEAM WAFER DICING EQUIPMENT

(71) Applicant: Infineon Technologies AG, Neubiberg (DE)

(72) Inventors: Franz-Josef Pichler, Villach (AT);
Johannes Mueller, Villach (AT);
Christoph Ahamer, Villach (AT);
Gerald Lackner, Arnoldstein (AT);
Walter Leitgeb, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 234 days.

(21) Appl. No.: 17/942,441

(22) Filed: Sep. 12, 2022

(65) Prior Publication Data

US 2023/0098233 A1 Mar. 30, 2023

(30) Foreign Application Priority Data

Sep. 29, 2021 (DE) .......................... 102021125237.7

(51) Int. Cl.
*H01T 23/00* (2006.01)
*H01L 21/683* (2006.01)

(52) U.S. Cl.
CPC ...... *H01L 21/6833* (2013.01); *H01L 21/6836* (2013.01); *H01L 2221/68327* (2013.01)

(58) Field of Classification Search
None
See application file for complete search history.

(56) References Cited

U.S. PATENT DOCUMENTS

| | | | |
|---|---|---|---|
| 7,223,319 B2 * | 5/2007 | Kurosawa | H01L 21/6836 156/247 |
| 7,642,485 B2 | 1/2010 | Takeda et al. | |
| 7,649,157 B2 | 1/2010 | Izuka | |
| 9,620,355 B2 * | 4/2017 | Ryo | H01L 21/6836 |
| 10,532,411 B2 * | 1/2020 | Yamamoto | H01L 21/682 |
| 2005/0019980 A1 | 1/2005 | Kurosawa et al. | |
| 2009/0215246 A1 * | 8/2009 | Kitahara | B23K 26/0624 257/E21.001 |
| 2017/0025269 A1 | 1/2017 | Ryo et al. | |

FOREIGN PATENT DOCUMENTS

| | | |
|---|---|---|
| DE | 102016202073 A1 | 8/2016 |
| JP | 2011054715 A | 3/2011 |
| JP | 5443102 B2 | 12/2013 |
| JP | 2021136257 A | 9/2021 |

* cited by examiner

*Primary Examiner* — Stephen W Jackson
(74) *Attorney, Agent, or Firm* — Murphy, Bilak & Homiller, PLLC

(57) ABSTRACT

A chuck for a laser beam wafer dicing equipment includes a wafer support plate having an upper surface for holding a wafer disposed on a dicing tape. The upper surface includes a topographically structured surface region that partly or completely overlaps an edge of the wafer when the wafer disposed on the dicing tape is placed on the upper surface. The topographically structured surface region provides for a reduction in an area of contact between the upper surface and the dicing tape.

19 Claims, 2 Drawing Sheets

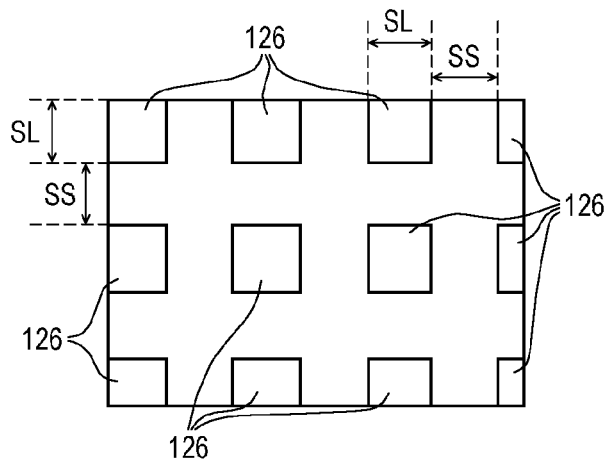

Fig. 2C

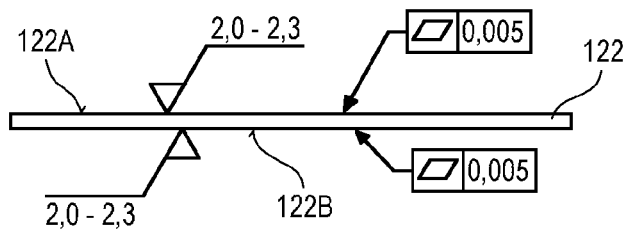

Fig. 3

| Placing a wafer on an upper surface of a wafer support plate of a chuck, wherein a dicing tape is disposed between the upper surface and the wafer, and the upper surface comprises a topographically structured surface region that overlaps the wafer edge, wherein the topographically structured surface region provides for a reduction in the area of contact between the upper surface and the dicing tape | ~S1 |
|---|---|
| Cutting the wafer into dies by passing a laser beam over the wafer | ~S2 |
| Lifting the dicing tape together with the dies off the upper surface | ~S3 |

Fig. 4

WAFER CHUCK FOR A LASER BEAM WAFER DICING EQUIPMENT

TECHNICAL FIELD

The disclosure relates the field of wafer handling, and in particular to a wafer chuck and a method for laser beam wafer dicing.

BACKGROUND

One specific process in wafer handling includes mounting a wafer on a dicing tape and separating the wafer into dies by using a laser beam wafer dicing equipment. More specifically, the wafer mounted on the dicing tape is placed on an upper surface of a wafer support plate of a wafer chuck, and a laser beam is used to cut the wafer into dies when passed over the wafer.

A problem is that the dicing tape holding the wafer during the cutting process (die separation) may stick to the wafer support plate of the wafer chuck in the area outside the wafer edge (i.e. where the laser beam directly hits the tape). This may cause chuck contamination by tape residues sticking to the wafer support plate of the chuck and further difficulties, namely die-knocking, i.e. the already cut dies hit each other when the tape is lifted off with the cut wafer on it, or the tape sticks so strongly to the chuck that it cannot be lifted off at all. The process of chuck contamination is self-intensifying, and in addition, the upper surface of the chuck may be directly damaged by the laser beam in the overcut area.

Conventionally, chemical cleaning and high temperature cleaning of the chuck is used to remove the tape residue from the support plate of the chuck. This is usually performed about once a day and is quite costly.

Another way to avoid the difficulties is to use a dicing tape that is specifically suited to laser dicing. This is extremely demanding, as subsequent processes must be precisely matched to the new dicing tape. Thus, if a different dicing tape were used, many subsequent processes would have to be changed.

A third possibility is to stop the laser beam before reaching the wafer edge and to perform breaking of the wafer in the area of the wafer edge in the backend (BE), where the dicing tape is expanded. However, this is also not feasible from a practical point of view, since breaking the wafer edge in the BE generates particle contamination that is not acceptable at that stage of the procedure (e.g. during a BE pick and place process).

SUMMARY

According to an aspect of the disclosure a chuck for a laser beam wafer dicing equipment includes a wafer support plate having an upper surface for holding a wafer disposed on a dicing tape. The upper surface includes a topographically structured surface region that partly or completely overlaps the wafer edge when the wafer disposed on the dicing tape is placed on the upper surface. The topographically structured surface region provides for a reduction in the area of contact between the upper surface and the dicing tape.

According to another aspect of the disclosure a laser beam wafer dicing equipment includes a chuck as described above. The laser beam wafer dicing equipment further includes a laser unit for producing a laser beam configured to cut the wafer into dies when passed over the wafer.

According to another aspect of the disclosure a method of dicing a wafer includes placing a wafer on an upper surface of a wafer support plate of a chuck. A dicing tape is disposed between the upper surface and the wafer. The upper surface includes a topographically structured surface region that overlaps the wafer edge, wherein the topographically structured surface region provides for a reduction in the area of contact between the upper surface and the dicing tape. The wafer is cut into dies by passing a laser beam over the wafer. The dicing tape is lifted together with the dies off the upper surface.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

FIG. 2C is a schematic top view of an exemplary portion of a topographically structured surface region shown in FIG. 2B.

FIG. 3 is a schematic cross-sectional view of an example of a wafer support plate of an exemplary chuck illustrating surface roughness and surface flatness of the surfaces of the support plate.

FIG. 4 is a flowchart illustrating an exemplary method of dicing a wafer.

DETAILED DESCRIPTION

As used in this specification, layers or elements illustrated as adjacent layers or elements do not necessarily be directly contacted together; intervening elements or layers may be provided between such layers or elements. However, in accordance with the disclosure, elements or layers illustrated as adjacent layers or elements may in particular be directly contacted together, i.e. no intervening elements or layers are provided between these layers or elements, respectively.

The words "over" or "beneath" with regard to a part, element or material layer formed or located or disposed or arranged or placed "over" or "beneath" a surface may be used herein to mean that the part, element or material layer be located (e.g. placed, formed, arranged, disposed, placed, etc.) "directly on" or "directly under", e.g. in direct contact with, the implied surface. The word "over" or "beneath" used with regard to a part, element or material layer formed or located or disposed or arranged or placed "over" or "beneath" a surface may, however, either be used herein to mean that the part, element or material layer be located (e.g. placed, formed, arranged, deposited, etc.) "indirectly on" or "indirectly under" the implied surface, with one or more additional parts, elements or layers being arranged between the implied surface and the part, element or material layer.

Figure 1:
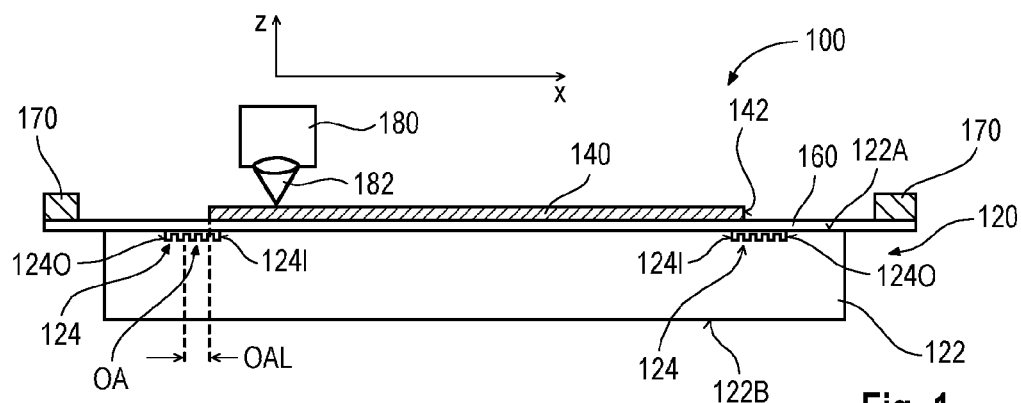
FIG. 1 is a schematic cross-sectional view of an example of a laser beam wafer dicing equipment.

Referring to FIG. 1, a laser beam wafer dicing equipment 100, in the following referred to as wafer dicing equipment 100, may include a chuck 120 and a laser unit 180 for producing a laser beam 182.

As known in the art, chucks are devices configured to support wafers during various stages of wafer processing. Usually, chucks are designed according to the wafer processing performed on the wafer while the wafer is being held by the chuck. In the following, a chuck 120 is considered which is designed to support a wafer during laser beam wafer dicing. Such chuck 120 is also referred to as a "dicing chuck" in the art.

FIG. 1 illustrates a part of such wafer dicing equipment 100, namely the chuck 120 and the laser unit 180. The wafer dicing equipment 100 may further comprise a mechanism (not shown) for carrying the chuck 120 and a mechanism (not shown) to which the laser unit 180 is mounted. These mechanisms allow to move the laser unit 180 relative to the chuck 120 in a lateral direction (X and/or Y-directions) and in the Z-direction (i.e. in a direction perpendicular to the plane defined by the X-direction and the Y-direction, with the Y-direction being perpendicular to the paper plane).

The chuck 120 includes a wafer support plate 122 having an upper surface 122A and a lower surface 122B opposite the upper surface 122A. Typically, the chuck 120 comprises additional plates (e.g. a chuck basement plate and/or a chuck vacuum plate) arranged beneath the wafer support plate 122. Such plates, which provide mechanical stability and/or vacuum functionality to the chuck 120, are not shown in FIG. 1. In other words, FIG. 1 only illustrates the top plate of the chuck 120, namely the wafer support plate 122.

The wafer support plate 122 may, e.g., comprise or be made of glass, e.g. quartz glass, or other material(s) such as, e.g., a metal material (e.g. stainless steel) or polycarbonate.

During operation of the wafer dicing equipment 100, a wafer 140 is placed on and held by the upper surface 122A of the wafer support plate 122. The wafer 140 is mounted on a dicing tape 160. That is, the dicing tape 160 has a lower surface which may directly contact the upper surface 122A of the wafer support plate 122, and as has an upper surface which may directly contact and stick to the lower surface of the wafer 140. That is, the dicing tape 160 is disposed between the upper surface 122A of the wafer support plate 122 and the wafer 140.

The dicing tape 160 may be affixed to a dicing frame 170. The dicing frame 170 is used as a transport and mounting tool of the dicing tape 160 with the wafer 140 mounted thereon. During the process of dicing the wafer 140, the dicing frame 170 may be fixed by releasable connection means (e.g. clamps or screw connections (not shown)) to the chuck 120. That is, the wafer support plate 122 and the dicing tape 160 are in a fixed positional relationship during operation of the wafer dicing equipment 100.

The dicing tape 160 is needed to support each die after die separation (i.e. after cutting the wafer 140 into a plurality of dies by passing the laser beam 182 over the wafer 140). After die separation, the dicing tape 160 is lifted together with the dies off the upper surface 122A of the wafer support plate 122. Lifting the dicing tape 160 together with the dies off the upper surface 122A may be done by a mechanism (not shown) which provides for a relative movement between the wafer support plate 122 and the dicing frame 170 in Z-direction.

The laser unit 180 may be of any kind suitable for laser dicing. In particular, a UV (ultraviolet) laser or a green laser (e.g. 532 nm wavelength) or an IR (infrared) laser may be used which is, e.g., efficient for separating of wafers 140 which require high energy for laser dicing. Further, a pulse laser may be used for separation.

The wafer 140 may be of any semiconductor material such as, e.g., SiC, Si, GaN, etc. The wafer 140 may have a thickness of equal to or greater than 20 µm or 40 µm or 100 µm. Depending on the semiconductor material and the wafer thickness, the laser energy and/or pulse length has to be chosen appropriately.

For example, SiC is a very mechanical resistant and electrical efficient material. The mechanical properties of SiC are comparable to diamond. Further, in the backend (BE) process, SiC dies are very sensitive, and this needs to be considered already at the stage of wafer separation.

To arrive at high yields, the dicing process needs to be adjusted to the thickness to the wafer and has to ensure a full separation and overcut on the wafer edge in order to guarantee complete wafer separation. In this overcut area OA (see FIG. 1), the full laser energy of the semiconductor dicing process is introduced into the dicing tape 160.

As a result, the dicing tape 160 can be modified or damaged by local melting on its upper side, backside and within the tape (e.g. at intermediate layers, if provided).

Further consequences of the laser beam 182 surpassing the wafer edge 142 are that the upper surface 122A of the wafer support plate 122 can be locally damaged (chip-outs) and/or that locally melted dicing tape 160 can stick to the upper surface 122A of the wafer support plate 122. The latter effect causes a contamination of the dicing chuck 120. Both effects, i.e. damage and contamination of the upper surface 122A of the wafer support plate 122, are self-intensifying, i.e. pre-damaged and/or pre-contaminated surface areas are more prone to further damage or contamination than intact surface areas.

As a result, the automated wafer lift-off from the wafer support plate 122 may become more difficult or may not work after a relatively small number of processed wafers 140. The contamination and damages (e.g. cut lines) at the upper surface 122A of the wafer support plate 122 will increase wafer per wafer. At the end, the sticky wafer 140 needs to be removed manually from the chuck 120. This can lead to wafer scrap. As a worst-case scenario from a product reliability point of view, the wafer lift-off (so-called de-chucking) is still possible, but a locally sticking dicing tape 160 may lead to bending of the dicing tape 160. As a result, die knocking can occur and may induce cracks and chipping at the dies.

For example, the above problems are severe when cutting a SiC wafer of a thickness of equal to or greater than 100 µm.

To avoid or at least mitigate these and other problems, the upper surface 122A of the wafer support plate 122 includes a topographically structured surface region 124. The structured surface region 124 partly or completely overlaps the wafer edge 142 when the wafer 140, mounted on the dicing tape 160, is placed on the upper surface 122A. The topographically structured surface region 124 provides for a reduction in the area of contact between the upper surface 122A and the dicing tape 160 in the vicinity of the wafer edge 142 (e.g. at least within the overcut area OA).

In other words, when cutting the wafer 140 into dies, a wafer edge overcut is applied. The overcut area length OAL is the radial dimension of the overcut area OA, see FIG. 1. The outer edge 124O of the topographically structured surface region 124 extends radially beyond the wafer edge 142 by at least the (maximum) overcut area length OAL.

The overcut area OA begins at the wafer edge 142. Its length OAL in the radial direction is defined by parameters such as the die size, wafer placement tolerances etc. Hence, different OALs may be used for different wafers. The topographically structured surface region 124 may be dimensioned to completely overlap the overcut area OA for all OALs (and hence, e.g., for all die sizes intended to be produced on the chuck 120), ensuring that wherever the (focused) laser beam 182 hits the dicing tape 160, the dicing tape 160 is supported by the topographically structured surface region 124.

The overcut area length OAL may be set to 1.5 mm or less. For example, OAL may be equal to or greater than or less than 0.3 mm or 0.6 mm or 0.9 mm or 1.2 mm or 1.5 mm.

The reduction of the contact surface between the dicing tape 160 and the upper surface 122A of the wafer support plate 122 reduces chuck contamination and therefore allows for a significant extension of the chuck cleaning time interval.

The reduction in the area of contact between the upper surface 122A and the dicing tape 160 reduces the probability of contamination and/or damage at the (residual) upper surface 122A. For instance, the reduction in the area of contact can be equal to or greater than 30% or 50% or 70% of the nominal area of the topographically structured surface region 124. The higher the reduction of the contact area, the lower is the probability for contamination and/or surface damage at the upper surface 122A of the wafer support plate 122.

In some examples, the reduction in the area of contact may be equal to or less than 30% or 50% or 70% of the nominal area of the topographically structured surface region 124. The higher the area of contact, the better is the support for the dicing tape 160 in the overcut area OA.

Figure 2A:
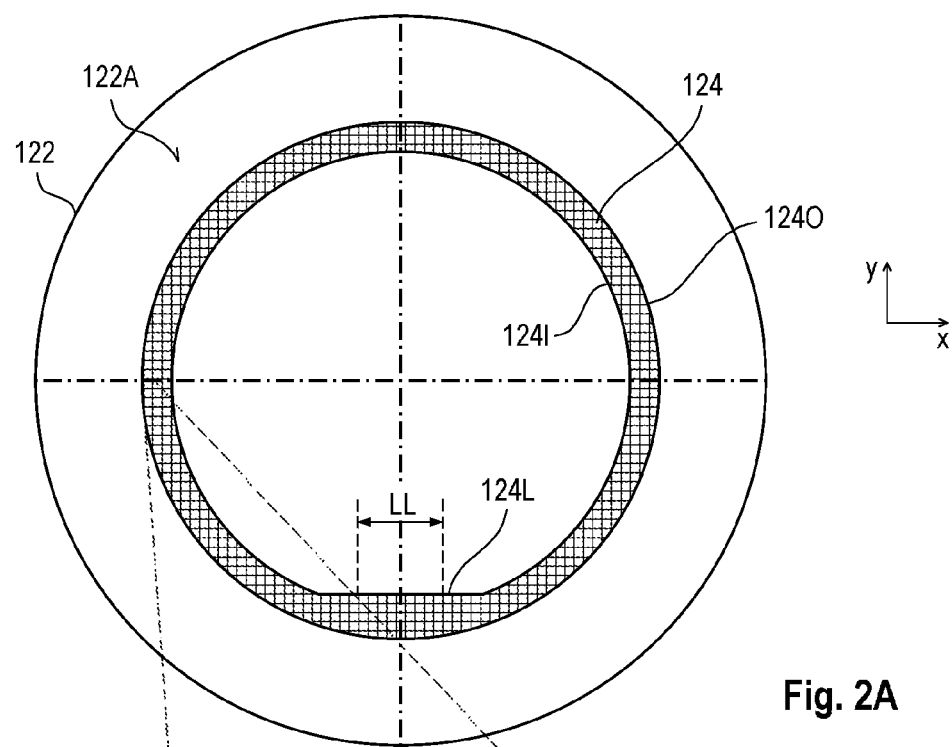
FIG. 2A is a schematic top view of an upper surface of a wafer support plate of an exemplary chuck for a laser beam wafer dicing equipment.
Figure 2B:
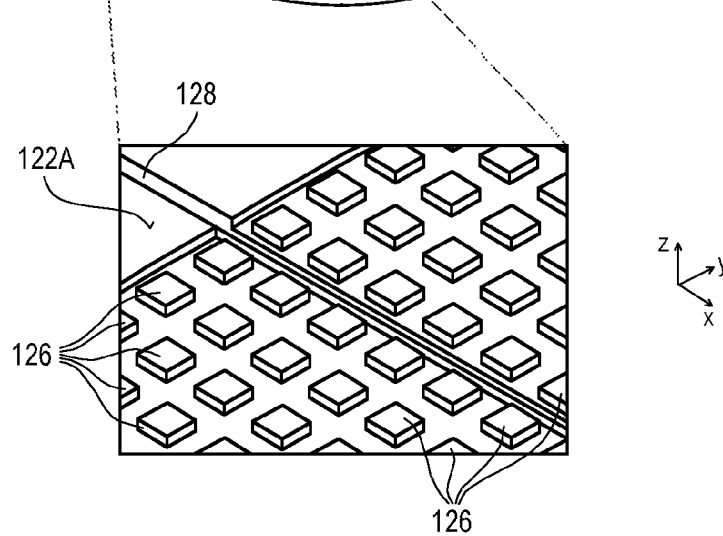
FIG. 2B is a schematic perspective view of an exemplary portion of a topographically structured surface region of the upper surface shown in FIG. 2A.

An example of a structure that may, e.g., be used for the topographically structured surface region 124 is shown in FIG. 2B. In this example the structure comprises or is composed of an array of small pedestals or posts formed, e.g., as cubes separated by grooves. Other possible shapes of such posts may include tapering structures such as, e.g., of a cone shape or a shape like a pyramid with a cut-away peak.

The topographically structured surface region 124 may be shaped as a ring, see FIG. 2A. The ring may have a circular inner edge 1241 and/or a circular outer edge 1240.

In other examples, the inner edge 1241 and/or the outer edge 1240 of the ring-shaped topographically structured surface region 124 may have a linear section 124L. In FIG. 2A the inner edge 1241 of the ring is shaped similar or in accordance (e.g. congruent) with the wafer edge 142 (i.e. with the contour of the wafer 140). For example, the wafer edge 142 may have a linear section, and so may the inner edge 1241 of the topographically structured surface region 124 may have a linear inner edge section 124L (e.g. a secant). The residual portion of the inner edge 1241 of the topographically structured surface region 124 may be rounded, in particular e.g. circular.

The inner edge 1241 of the topographically structured surface region 124 may have a somewhat smaller radial dimension than the wafer edge 142 along its entire circumferential extension in order to ensure that the wafer edge 142 is always positioned above and laterally within the topographically structured surface region 124 and to allow for some positional tolerances during wafer placement on the chuck 120.

The width of the topographically structured surface region 124 (i.e. the radial distance between the inner edge 1241 and the outer edge 1240) may, e.g. be equal to or greater than or less than 4 mm or 6 mm or 8 mm or 10 mm.

The wafer 140 may, e.g., be a 6 or 8 or 10 or 12 inch wafer. For instance, a 6 inch wafer 140 may have a contour as shown in FIG. 2A, while 8 or 10 or 12 inch wafers usually have a circular shape and hence, the inner edge 1241 (and optionally also the outer edge 1230) of ring-shaped topographically structured surface region 124 may be circular in shape.

A 6 inch wafer 140 may have a diameter in a range between 149.75 and 150.25 mm. The diameter of the inner edge 1241 of the topographically structured surface region 124 may, e.g., be about 146±0.2 mm. The diameter of the outer edge 1240 of the topographically structured surface region 124 may, e.g., be 154±0.2 mm. The linear length of a 6 inch wafer 140 may, e.g., be in a range between 46 and 49 mm. Hence, the linear length LL of the linear section 124L of the inner edge 1241 of the topographically structured surface region 124 may be in a range between, e.g., 45 mm and 55 mm.

For an 8 inch wafer 140, the diameter of the inner edge 1241 of the topographically structured surface region 124 may, e.g., be about 196±0.2 mm. The diameter of the outer edge 1240 of the topographically structured surface region 124 may, e.g., be 204±0.2 mm. For a 12 inch wafer 140, the diameter of the inner edge 1241 of the topographically structured surface region 124 may, e.g., be about 296±0.2 mm. The diameter of the outer edge 1240 of the topographically structured surface region 124 may, e.g., be 304±0.2 mm. As mentioned above, the 8 and 12 inch wafers 140 the topographically structured surface region 124 may have fully circular inner and/or outer edges 1241, 1240.

As illustrated in FIGS. 2B and 2C, the topographically structured surface region 124 may include a structure pattern. The structure pattern may comprise an array of insular posts 126. The array of insular posts 126 may, e.g., be a regular array, as illustrated in FIGS. 2B and 2C.

The structure height of the structured pattern may be equal to or greater than 0.01 mm or 0.025 mm or 0.05 mm. In the example shown the structure height (or groove depth) is e.g. 0.06 mm. The structure height (i.e. the groove depth) may, e.g., be equal to or less than 0.2 mm or 0.1 mm or 0.07 mm.

A structure length SL of the structured pattern (i.e. a lateral dimension of an insular post 126) may be equal to or greater than or smaller than 0.1 mm or 0.2 mm or 0.3 mm or 0.4 mm or 0.6 mm. In the example shown, SL=0.2 mm.

A structure spacing SS between adjacent insular posts 126 (i.e. the groove width) may be equal to or greater than or less than 0.1 mm or 0.15 mm or 0.2 mm or 0.25 mm or 0.3 mm. In the example shown, SS=0.2 mm.

While in FIGS. 2B and 2C the insular posts 126 are exemplified to have a square cross-section, other cross sectional shapes such as circular, polygonal (e.g. triangle, rectangular, pentagonal, hexagonal, . . . ) are also possible.

In all examples the structure pattern may be complementary to a lattice pattern. For example, in FIGS. 2B and 2C the grooves between the insular posts 126 are shaped as a square lattice.

The topographically structured surface region 124 may be in communication with a vacuum system of the chuck 120. Referring to FIG. 2B, a vacuum groove 128 may intersect the topographically structured surface region 124. By way of example, the vacuum groove 128 may extend in a radial direction. The vacuum groove 128 may have a depth greater than the depth of the grooves between the insular posts 126 and/or may have a width smaller than the width of the grooves between the insular posts 126.

That way the vacuum system of the chuck 120, which is configured to hold the dicing tape 160 to the upper surface 122A of the wafer support plate 122 by suction, is connected to the topographically structured surface region 124 to also act in this part of the wafer support plate 122. Other possibilities than the vacuum grooves 128 are to use holes or bores (not shown) opening into the grooves between the insular posts 126 for connecting the vacuum system of the chuck 120 to the topographically structured surface region 124.

By using these or other approaches, no changes of the vacuum supply system of the chuck 120 needs to be carried out.

Since the vacuum suction tends to pull the dicing tape 160 into the structure spaces (e.g. grooves) between the insular posts 126, the structure spacing SS (e.g. groove width) needs to be limited in order to avoid a significant bending of the dicing tape 160 at and beyond the inner edge 1241 of the topographically structured surface region 124.

Further, the dimension of the structure spacing SS may depend on the smallest available die size. More specifically, the structure spacing SS should be less than, e.g., the smallest die size to avoid that the smallest dies are sucked into the grooves.

Therefore, it may be beneficial that the structure spacing SS may be equal to or less than 0.2 mm or 0.15 mm at least in the OA near the inner edge 1241 of the topographically structured surface region 124 where dicing is carried out.

Referring to FIG. 3, the residual part of the upper surface 122A of the wafer support plate 122 may have a small roughness and/or a high flatness. More specifically, the upper surface 122A (and optionally also the lower surface 122B) may have a roughness equal to or less than 2.5 μm in a surface region radially inside the topographically structured surface region 124 and/or in a surface region radially outside the topographically structured surface region 124. Particularly, the roughness may be in a range between 2.0 μm and 2.3 μm. Further, the upper surface 122A (and optionally also the lower surface 122B) of the wafer support plate 122 may have a flatness of equal to or less than 0.005 mm in a surface region radially inside the topographically structured surface region 124 and/or in a surface region radially outside the topographically structured surface region 124.

As already mentioned above, the wafer support plate 122 may, e.g., be of glass, e.g. quartz glass. In this case, the structuring to form the topographically structured surface region 124 can be carried out by using a LIDE (laser induced deep etching) process.

The diameter of the wafer support plate 122 may, e.g., be about 220 mm. The thickness of the wafer support plate 122 may, e.g., be about 10 mm.

Referring to FIG. 4, a process of dicing a wafer may comprise at S1 placing the wafer on an upper surface of a wafer support plate of a chuck, wherein a dicing tape is disposed between the upper surface and the wafer. The upper surface comprises a topographically structured surface region that overlaps the wafer edge. The topographically structured surface region provides for a reduction in the area of contact between the upper surface and the dicing tape.

As described before, the reduction in contact area compared to the nominal (i.e. full) surface area reduces the probability of surface damage and/or surface contamination of the support plate of the chuck, thus extending the cleaning interval.

At S2 the wafer is cut into dies by passing a laser beam over the wafer. The energy of the laser beam has to be set in accordance with the parameters of laser dicing, including in particular the material of the wafer, the thickness of the wafer and (optionally) the thickness of dicing tape. The dicing tape may, e.g., be relatively thin (compared to dicing tapes which otherwise would need to be used in order to avoid surface damage or surface contamination) and may have, e.g., a thickness equal to or less than 200 μm or 150 μm or 100 μm.

At S3 the dicing tape is lifted off the upper surface of the wafer support plate of the chuck. Lifting the dicing tape may be accomplished by moving the dicing frame 170 away from the chuck 120 (see FIG. 1). As mentioned above, the lift-off procedure is greatly facilitated by the provision of the topographically structured surface region 124 on the upper surface 122A of the wafer support plate 122 of the chuck 120.

The following examples pertain to further aspects of the disclosure:

Example 1 is a chuck for a laser beam wafer dicing equipment includes a wafer support plate having an upper surface for holding a wafer disposed on a dicing tape. The upper surface includes a topographically structured surface region that partly or completely overlaps the wafer edge when the wafer disposed on the dicing tape is placed on the upper surface. The topographically structured surface region provides for a reduction in the area of contact between the upper surface and the dicing tape.

In Example 2, the subject matter of Example 1 can optionally include wherein the reduction in the area of contact is equal to or greater than 30% or 50% or 70% of the nominal area of the topographically structured surface region.

In Example 3, the subject matter of Example 1 or 2 can optionally include wherein the reduction in the area of contact is equal to or less than 30% or 50% or 70% of the nominal area of the topographically structured surface region.

In Example 4, the subject matter of any preceding Example can optionally include wherein the topographically structured surface region is shaped as a ring.

In Example 5, the subject matter of any preceding Example can optionally include wherein the wafer support plate comprises a vacuum system configured to hold the dicing tape to the upper surface by suction, wherein the topographically structured surface region is in communication with the vacuum system.

In Example 6, the subject matter of any preceding Example can optionally include wherein the topographically structured surface region comprises a structure pattern with a structure height equal to or greater than 0.01 mm.

In Example 7, the subject matter of any preceding Example can optionally include wherein the topographically structured surface region comprises a structure pattern with a structure length equal to or greater than 0.1 mm in one or any lateral direction.

In Example 8, the subject matter of any preceding Example can optionally include wherein the topographically structured surface region comprises a structure pattern with a structure spacing equal to or greater than 0.15 mm in one or any lateral direction.

In Example 9, the subject matter of any of the Examples 6 to 8 can optionally include wherein the structure pattern comprises an array of insular posts.

In Example 10, the subject matter of any of the Examples 6 to 9 can optionally include wherein the structure pattern is complementary to a lattice pattern.

In Example 11, the subject matter of any of the preceding Examples can optionally include wherein the upper surface comprises a surface region radially inside the topographically structured surface region that has a roughness equal to or less than 2.5 μm.

In Example 12, the subject matter of any preceding Example can optionally include wherein the upper surface comprises a surface region radially inside the topographically structured surface region that has a flatness of equal to or less than 0.005 mm.

In Example 13, the subject matter of any preceding Example can optionally include wherein the wafer support plate is of quartz glass.

Example 14 is a laser beam wafer dicing equipment comprising a chuck according to any of the preceding Examples and a laser unit for producing a laser beam configured to cut the wafer into dies when passed over the wafer.

In Example 15, the subject matter of Example 14 can optionally include wherein the laser unit comprises a pulse laser.

In Example 16, the subject matter of Example 14 or 15 can optionally include wherein the laser unit comprises a UV laser or a green laser or an IR laser.

Example 17 is a method of dicing a wafer, the method comprising: placing a wafer on an upper surface of a wafer support plate of a chuck, wherein a dicing tape is disposed between the upper surface and the wafer, and the upper surface comprises a topographically structured surface region that overlaps the wafer edge, wherein the topographically structured surface region provides for a reduction in the area of contact between the upper surface and the dicing tape; cutting the wafer into dies by passing a laser beam over the wafer; and lifting the dicing tape together with the dies off the upper surface.

In Example 18, the subject matter of Example 17 can optionally further include applying a wafer edge overcut when cutting the wafer into dies, wherein the wafer edge overcut length depends on the size of the dies to be produced, and wherein the topographically structured surface region projects radially beyond the wafer edge by at least the maximum overcut length.

In Example 19, the subject matter of Example 17 or 18 can optionally include wherein the wafer is a SiC wafer.

In Example 20, the subject matter of any of Examples 17 to 19 can optionally include wherein the wafer has a thickness of equal to or greater than 100 μm.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A chuck for a laser beam wafer dicing equipment, the chuck comprising:
   a wafer support plate having an upper surface for holding a wafer disposed on a dicing tape,
   wherein the upper surface comprises a topographically structured surface region that partly or completely overlaps an edge of the wafer when the wafer disposed on the dicing tape is placed on the upper surface, the topographically structured surface region providing for a reduction in an area of contact between the upper surface and the dicing tape,
   wherein the topographically structured surface region comprises a structure pattern comprising an array of insular posts.

2. The chuck of claim 1, wherein the reduction in the area of contact is equal to or greater than 30% or 50% or 70% of a nominal area of the topographically structured surface region.

3. The chuck of claim 1, wherein the reduction in the area of contact is equal to or less than 30% or 50% or 70% of the nominal area of the topographically structured surface region.

4. The chuck of claim 1, wherein the topographically structured surface region is shaped as a ring.

5. The chuck of claim 1, wherein the wafer support plate comprises a vacuum system configured to hold the dicing tape to the upper surface by suction, wherein the topographically structured surface region is in communication with the vacuum system.

6. The chuck of claim 1, wherein the structure pattern has a structure height equal to or greater than 0.01 mm.

7. The chuck of claim 1, wherein the structure pattern has a structure length equal to or greater than 0.1 mm in one or any lateral direction.

8. The chuck of claim 1, wherein the structure pattern has a structure spacing equal to or greater than 0.15 mm in one or any lateral direction.

9. The chuck of claim 1, wherein the structure pattern is complementary to a lattice pattern.

10. The chuck of claim 1, wherein the upper surface comprises a surface region radially inside the topographically structured surface region that has a roughness equal to or less than 2.5 μm.

11. The chuck of claim 1, wherein the upper surface comprises a surface region radially inside the topographically structured surface region that has a flatness of equal to or less than 0.005 mm.

12. The chuck of claim 1, wherein the wafer support plate comprises quartz glass.

13. A laser beam wafer dicing equipment, comprising:
    the chuck of claim 1; and
    a laser unit configured to produce a laser beam configured to cut the wafer into dies when passed over the wafer.

14. The laser beam wafer dicing equipment of claim 13, wherein the laser unit comprises a pulse laser.

15. The laser beam wafer dicing equipment of claim 13, wherein the laser unit comprises a UV laser or a green laser or an IR laser.

16. A method of dicing a wafer, the method comprising:
    placing a wafer on an upper surface of a wafer support plate of a chuck, wherein a dicing tape is disposed between the upper surface and the wafer, wherein the upper surface comprises a topographically structured surface region that overlaps an edge of the wafer, wherein the topographically structured surface region provides for a reduction in an area of contact between the upper surface and the dicing tape, wherein the topographically structured surface region comprises a structure pattern comprising an array of insular posts;
    cutting the wafer into dies by passing a laser beam over the wafer; and
    lifting the dicing tape together with the dies off the upper surface.

17. The method of claim 16, further comprising:
    applying a wafer edge overcut when cutting the wafer into dies, wherein the wafer edge overcut length depends on a size of the dies to be produced, and wherein the topographically structured surface region projects radially beyond the wafer edge by at least the maximum overcut length.

18. The method of claim 16, wherein the wafer is a SiC wafer.

19. The method of claim 16, wherein the wafer has a thickness of equal to or greater than 100 µm.

* * * * *